United States Patent
Doi et al.

(10) Patent No.: US 9,251,955 B2
(45) Date of Patent: Feb. 2, 2016

(54) PZT-BASED FERROELECTRIC THIN FILM AND METHOD OF FORMING THE SAME

(71) Applicant: MITSUBISHI MATERIALS CORPORATION, Tokyo (JP)

(72) Inventors: Toshihiro Doi, Naka-gun (JP); Hideaki Sakurai, Naka-gun (JP); Nobuyuki Soyama, Naka-gun (JP); Takashi Noguchi, Akita (JP)

(73) Assignee: MITSUBISHI MATERIALS CORPORATION, Tokyo (JP)

( * ) Notice: Subject to any disclaimer, the term of this patent is extended or adjusted under 35 U.S.C. 154(b) by 157 days.

(21) Appl. No.: 14/182,308

(22) Filed: Feb. 18, 2014

(65) Prior Publication Data
US 2014/0293505 A1    Oct. 2, 2014

(30) Foreign Application Priority Data
Mar. 29, 2013    (JP) .................. 2013-073150

(51) Int. Cl.
*H01G 4/06* (2006.01)
*H01G 4/08* (2006.01)
*H01G 4/018* (2006.01)
(Continued)

(52) U.S. Cl.
CPC .. *H01G 4/08* (2013.01); *B05D 1/38* (2013.01); *B05D 3/0254* (2013.01); *C23C 16/409* (2013.01); *H01G 4/018* (2013.01); *H01G 4/06* (2013.01); *H01G 4/30* (2013.01); *H01L 21/02197* (2013.01); *H01L 21/02282* (2013.01);
(Continued)

(58) Field of Classification Search
CPC ............ H01G 4/08; H01G 4/06; H01G 4/10; H01G 4/30; H01G 4/018

USPC ........ 361/311, 301.1, 301.2, 302–305, 306.1, 361/306.3, 312–313, 321.1, 321.2
See application file for complete search history.

(56) References Cited

U.S. PATENT DOCUMENTS

| 5,817,170 A | 10/1998 | Desu et al. |
| 6,066,581 A * | 5/2000 | Chivukula ............ C04B 35/491 106/287.19 |

(Continued)

FOREIGN PATENT DOCUMENTS

| JP | 06-148704 A | 5/1994 |
| JP | 10-270772 A | 10/1998 |

(Continued)

OTHER PUBLICATIONS

T. Noguchi et al. "Influence of Film Texture on Reliability of Sol-gel Derived PZT Thin-film Capacitors," Key Engineering Materials vol. 566, 2013, pp. 7-11 and a cover page.

(Continued)

*Primary Examiner* — Nguyen T Ha
(74) *Attorney, Agent, or Firm* — Locke Lord LLP

(57) ABSTRACT

A PZT-based ferroelectric thin film is formed by coating a PZT-based ferroelectric thin film-forming composition on a lower electrode of a substrate one or two or more times, pre-baking the composition, and baking the composition to be crystallized, and this thin film includes PZT-based particles having an average particle size in a range of 500 nm to 3000 nm when measured on a surface of the thin film, in which heterogeneous fine particles having an average particle size of 20 nm or less, which are different from the PZT-based particles, are precipitated on a part or all of the grain boundaries on the surface of the thin film.

20 Claims, 2 Drawing Sheets

(51) Int. Cl.
| | |
|---|---|
| *H01G 4/30* | (2006.01) |
| *C23C 16/40* | (2006.01) |
| *H01L 21/02* | (2006.01) |
| *H01L 49/02* | (2006.01) |
| *B05D 1/38* | (2006.01) |
| *B05D 3/02* | (2006.01) |

(52) U.S. Cl.
CPC .......... *H01L 21/02356* (2013.01); *H01L 28/55* (2013.01)

(56) References Cited

U.S. PATENT DOCUMENTS

| | | | | |
|---|---|---|---|---|
| 6,126,743 A * | 10/2000 | Saegusa | ................... | C03C 10/00 117/54 |
| 6,809,052 B2 * | 10/2004 | Horie | ................... | C01G 23/003 252/62.3 BT |
| 7,706,125 B2 * | 4/2010 | Fukuda | ................ | H01G 4/1227 29/25.42 |
| 8,889,472 B2 * | 11/2014 | Miller | ................... | B82Y 10/00 257/E21.24 |
| 2010/0081559 A1 * | 4/2010 | Zhang | ................... | C04B 35/468 501/137 |

FOREIGN PATENT DOCUMENTS

| | | |
|---|---|---|
| JP | 11-307834 A | 11/1999 |
| JP | 2007-019554 A | 1/2007 |
| JP | 2011-238708 A | 11/2011 |
| JP | 2012-009800 A | 1/2012 |
| WO | WO-2012/165110 A1 | 12/2012 |

OTHER PUBLICATIONS

Sharon A Myers et al., "Microstructural Characterization of Ferroelectric Thin Films for Non-Volatile Memory Applications," Materials Research Soc. Symp., vol. 200, Jan. 1, 1990, pp. 231-236.

Y. L. Tu et al., "Processing and characterization of Pb(Zr, Ti) $O_3$ films, up to 10 μm thick, produced from a diol sol-gel route," Journal of Materials Research, vol. 11, No. 10, Oct. 1, 1996, pp. 2556-2564.

European Search Report dated May 13, 2014, issued for the European patent application No. 14155492.3.

Katsuhiro Aoki, et al., "P-E characteristics for 125-nm-thick PZT film prepared by Sol-Gel technique," Proceedings of the Japan Society of Applied Physics and Related Societies Spring 1994 No. 2, Japan Society of Applied Physics, Mar. 28, 1994, p. 457 (30p-ME-5) and English translation thereof.

Office Action mailed May 13, 2014, issued for the Japanese patent application No. 2014-050215 and English translation thereof.

Decision of Rejection mailed Aug. 19, 2014, issued for the Japanese patent application No. 2014-050215 and English translation thereof.

* cited by examiner

PZT-BASED FERROELECTRIC THIN FILM AND METHOD OF FORMING THE SAME

BACKGROUND OF THE INVENTION

1. Field of the Invention

The present invention relates to a PZT-based ferroelectric thin film, which can be used for a dielectric layer or the like of a thin film capacitor, and a method of forming the same. More specifically, the invention relates to a PZT-based ferroelectric thin film having superior electrical properties, long service life, and superior mass-productivity; and a method of forming the same.

Priority is claimed on Japanese Patent Application No. 2013-73150, filed on Mar. 29, 2013, the content of which is incorporated herein by reference.

2. Description of Related Art

When a ferroelectric thin film is formed using a sol-gel method, typically, a high-temperature process such as pre-baking or baking is performed. Therefore, when an attempt to obtain a thicker film is made by increasing the coating amount applied in each coating process, tensile stress generated in the film during baking or the like is increased, which may cause a problem of cracking in the formed film.

When cracking occurs in the formed film, the electrical properties or the like of the ferroelectric thin film deteriorate. In the related art, the thickness of a film which can be formed in each coating process using a sol-gel method is limited to about 100 nm. In order to form a thick ferroelectric thin film, a method of performing coating and baking processes of a composition multiple times is adopted. However, with this method, production efficiency decreases, which leads to an increase in film forming cost. Therefore, studies and developments have been actively made regarding improvement of a material, that is, regarding a raw material solution capable of increasing the thickness of a film formed in each coating process without cracking.

In addition, one of the issues during the formation of a ferroelectric thin film using a sol-gel method is to increase the service life of a thin film. For example, the document "Influence of Film Texture on Reliability of Sol-gel Derived PZT Thin-film Capacitors (T. Noguchi, et. al. Key Eng. Mater. In press (2013))" reports that, by laminating layers of a sol-gel solution to which a specific organic dopant is added, a PZT ferroelectric thin film having grown crystal grains can be formed, and the service life of the obtained thin film is longer than that of a thin film of the related art having fine crystal grains. Japanese Unexamined Patent Application, First Publication No. 2012-009800 (claim 1, paragraph [0012]) focuses on a structure of a ferroelectric thin film and discloses a ferroelectric thin film in which a microstructure is controlled to improve service life reliability. The ferroelectric thin film disclosed in Japanese Unexamined Patent Application, First Publication No. 2012-009800 has a configuration of a mixed composite metal oxide in which metal oxides B composed of Bi, Si, and the like are mixed with a PZT-based composite metal oxide A at a predetermined molar ratio. In this configuration, 2 to 23 baked layers are laminated, the thickness t of each of the baked layers is 45 nm to 500 nm, an average value x of maximum grain sizes of crystal grains present in each of the baked layers in a predetermined direction is 200 nm to 5000 nm, and all the baked layers satisfy a relationship of $1.5t<x<23t$. In the ferroelectric thin film disclosed in Japanese Unexamined Patent Application, First Publication No. 2012-009800, the grain size of crystal grains present in each of the baked layers is increased to be greater than that of crystal grains present in a thin film prepared using a CSD method of the related art, and interfaces are introduced into the film by laminating a plurality of baked layers. As a result, the service life reliability of a thin film capacitor or the like is improved.

SUMMARY OF THE INVENTION

Technical Problem

However, in the ferroelectric thin film disclosed in Japanese Unexamined Patent Application, First Publication No. 2012-009800, in order to introduce interfaces to improve the service life reliability into a film, it is necessary that the plurality of baked layers be laminated, which makes a manufacturing process significantly complex. In addition, according to "Influence of Film Texture on Reliability of Sol-gel Derived PZT Thin-film Capacitors" and the like, in order to obtain a ferroelectric thin film having a predetermined thickness, it is necessary that the coating amount applied in each coating process be decreased to prevent cracking after film formation and the coating process be performed multiple times. Therefore, further improvement particularly in mass-productivity and the like is required.

An object of the invention is to provide a PZT-based ferroelectric thin film having a small frequency of cracks, a dense structure, superior electrical properties, and long service life and, even when the coating amount applied in each coating process is increased, having a small frequency of cracks and superior mass-productivity; and a method of forming the same.

Solution to Problem

According to a first aspect of the invention, there is provided a PZT-based ferroelectric thin film which is formed by coating a PZT-based ferroelectric thin film-forming, composition on a lower electrode of a substrate one or two or more times, pre-baking the composition, and baking the composition to be crystallized, the thin film including: PZT based particles having an average particle size in a range of 500 nm to 3000 nm when measured on a surface of the thin film, in which heterogeneous fine particles having an average particle size of 20 nm or less, which are different from the PZT-based particles, are precipitated on a part or all of the grain boundaries on the surface of the thin film.

According to a second aspect of the invention, in the PZT-based ferroelectric thin film according to the first aspect, it is preferable that the thickness of a thin film formed in each coating process be in a range of 100 nm to 400 nm.

According to a third aspect of the invention, in the PZT-based ferroelectric thin film according to the first or second aspect, it is preferable that the total thickness of the thin film be in a range of 100 nm to 5000 nm.

According to a fourth aspect of the invention, there is provided a method of forming a PZT-based ferroelectric thin film, the method including: coating a PZT-based ferroelectric thin film-forming composition, which contains a PZT precursor, on a lower electrode of a substrate once or twice or more; pre-baking the composition; and baking the composition to be crystallized and to form a PZT-based ferroelectric thin film on the lower electrode, in which the composition contains 105 mol to 115 mol of Pb with respect to 100 mol of the total amount of Ti and Zr contained in the composition, and the composition contains 0.15 mol to 0.50 mol of a high-molecular compound in terms of monomers with respect to 1 mol of the PZT precursor.

According to a fifth aspect of the invention, in the method of forming a PZT-based ferroelectric thin film according to the fourth aspect, it is preferable that a coating amount of the composition in each coating process be set such that the thickness of a thin film formed in each coating process be in a range of 100 nm to 400 nm.

According to a sixth aspect of the invention, in the method of forming a PZT-based ferroelectric thin film according to the fourth or fifth aspect, it is preferable that a PZT-based ferroelectric thin film having a total thickness in a range of 100 nm to 5000 nm be obtained by applying a coat of the composition one or two or more times.

According to a seventh aspect of the invention, there is provided a complex electronic component including: the PZT-based ferroelectric thin film according to any one of the first to third aspects or a PZT-based ferroelectric thin film formed using the method according to any one of the fourth to sixth aspects, in which the complex electronic component is a thin film capacitor, a capacitor, an IPD, a DRAM memory capacitor, a laminated capacitor, a gate insulator of a transistor, a non-volatile memory, a pyroelectric infrared detecting element, a piezoelectric element, an electro-optic element, an actuator, a resonator, an ultrasonic motor, an electric switch, an optical switch, or an LC noise filter element.

Advantageous Effects of Invention

The PZT-based ferroelectric thin film according to the first aspect is formed by coating a PZT-based ferroelectric thin film-forming composition on a lower electrode of a substrate once or twice or more, pre-baking the composition, and baking the composition to be crystallized, the thin film including: PZT-based particles having an average particle size in a range of 500 nm to 3000 nm when measured on a surface of the thin film, in which heterogeneous fine particles having an average particle size of 20 nm or less, which are different from the PZT-based particles, are precipitated on a part or all of the grain boundaries on the surface of the thin film. As a result, in the PZT-based ferroelectric thin film according to the invention, the generation of cracks is significantly decreased, and a dense structure is obtained. Therefore, electrical properties and service life reliability are superior. In addition, by a relative dielectric constant being improved, the capacity density of the thin film as a thin film capacitor can be improved.

In the PZT-based ferroelectric thin film according to the second aspect, the thickness of a thin film formed in each coating process is in a range of 100 nm to 400 nm. As a result, heterogeneous fine particles having an average particle size of 20 nm or less, which are different from the PZT-based particles, can be precipitated on a part or all of the grain boundaries on the surface of the thin film. In addition, since the thickness of a film formed in each coating process is greater than or equal to several hundreds of nanometers, mass-productivity is superior.

In the UT-based ferroelectric thin film according to the third aspect, the total thickness of the thin film is in a range of 100 nm to 5000 nm. When this thin film is compared to a PZT-based ferroelectric thin film obtained using a sol-gel method of the related art, in spite that the number of forming processes such as the number of coating processes is small, electrical properties and service life reliability are superior, and the thickness is relatively thick. Therefore, mass-productivity is significantly superior.

The method of forming a PZT-based ferroelectric thin film according to the fourth aspect includes: coating a PZT-based ferroelectric thin film-forming composition, which contains a PZT precursor, on a lower electrode of a substrate once or twice or more; pre-baking the composition; and baking the composition to be crystallized and to form a PZT-based ferroelectric thin film on the lower electrode, in which the composition contains 105 mol to 115 mol of Pb with respect to 100 mol of a total amount of Ti and Zr contained in the composition, and the composition contains 015 mol to 0.50 mol of a high-molecular compound in terms of monomers with respect to 1 mol of the PZT precursor. As a result, it is possible to form a PZT-based ferroelectric thin film having a small frequency of cracks, a dense structure, superior electrical properties, and a significantly long service life.

In the method of forming a PZT-based ferroelectric thin film according to the fifth aspect, a coating amount of the composition in each coating process is set such that the thickness of a thin film formed in each coating process is in a range of 100 nm to 400 nm. As a result, heterogeneous fine particles having an average particle size of 20 nm or less, which are different from the PZT-based particles, can be precipitated on a part or all of the grain boundaries on the surface of the thin film. The PZT-based ferroelectric thin film can be formed with high production efficiency.

In the method of forming a PZT-based ferroelectric thin film according to the sixth aspect, a PZT-based ferroelectric thin film having a total thickness in a range of 100 nm to 5000 nm is obtained by coating the composition once or twice or more. When the method according to the invention is compared to a method of forming a PZT-based ferroelectric thin film using a sol-gel method of the related art, a relatively thick film having superior electrical properties and service life reliability can be formed with a small number of coating processes. As a result, production efficiency can be significantly increased.

The thin film capacitor or the like according to the seventh aspect includes the PZT-based ferroelectric thin film according to any one of the first to third aspects or a PZT-based ferroelectric thin film formed using the method according to any one of the fourth to sixth aspects which has an extremely small frequency of cracks and a dense structure. Therefore, electrical properties, service life reliability, and mass-productivity are superior.

DETAILED DESCRIPTION OF THE INVENTION

Hereinafter, embodiments of the invention will be described based on the drawings.

Figure 1:
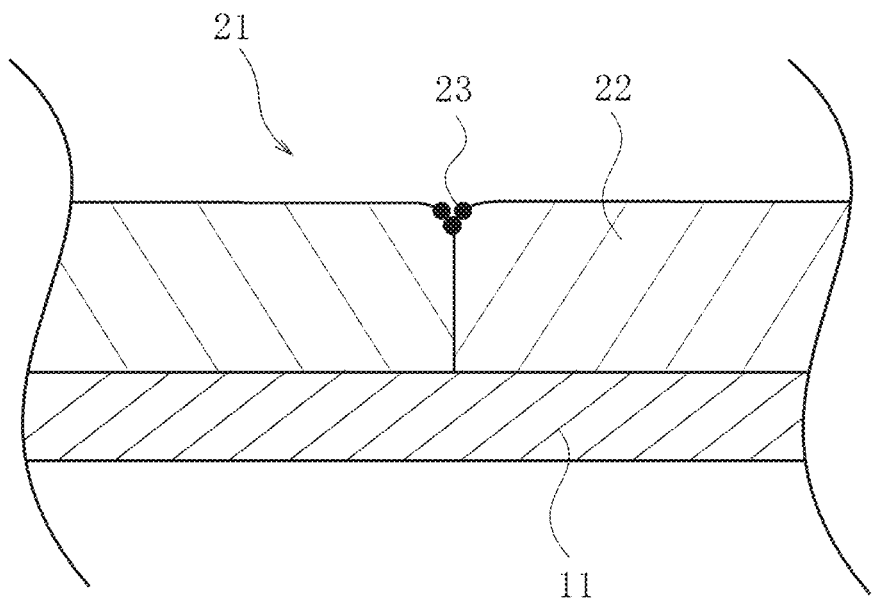
FIG. 1 is a cross-sectional view schematically illustrating a PZT-based ferroelectric thin film according to an embodiment of the invention.

A PZT-based ferroelectric thin film according to an embodiment of the invention is an improved PZT-based ferroelectric thin film 21, as illustrated in FIG. 1, which is formed by coating a PZT-based ferroelectric thin film-forming composition on a lower electrode 11 of a substrate once or twice or more, prebaking the composition, and baking the composition to be crystallized. As a characteristic configuration, the thin film 21 includes PZT-based particles 22 having an average particle size in a range of 500 nm to 3000 nm when measured on a surface of the thin film 21, in which the thickness of a thin film formed in each coating process is in a range of 100 nm to 400 nm. As a result, PZT crystal grains are grown, and, as described below, the amount of lead is decreased as compared to the related art. For these reasons, heterogeneous fine particles 23 having an average particle size of 20 nm or less, which are different from the PZT-based particles 22, are precipitated on a part or all of the grain boundaries on the surface of the thin film 21.

In the PZT-based ferroelectric thin film 21 according to the embodiment, the thickness of a thin film formed in each coating process is in a range of 100 nm to 400 nm. When the thickness is less than 100 nm, PZT crystal particles are not grown, and the heterogeneous fine particles 23 different from the PST-based particles 22 are not precipitated on a part or all of the grain boundaries on the surface of the thin film 21. In addition, when the thickness is greater than 400 nm, a large amount of high-molecular compound is required, and productivity deteriorates. In addition, when the thickness of a thin film formed in each coating process is greater than the upper limit, the film is porous. As a result, the relative dielectric constant deteriorates, and the service life is likely to decrease. On the other hand, when the thickness of a thin film formed in each coating process is less than the lower limit, crystal grains are fine, and thus service life reliability is not obtained. In addition, the improvement of productivity cannot be expected, which is not preferable. As described above, in the PZT-based ferroelectric thin film 21 according to the embodiment, the generation of cracks is rare, and the thickness of a thin film formed in each coating process is several hundreds of nanometers and thus is significantly superior in production efficiency and the like to a thin film formed using a sol-gel method of the related art. The thickness of a thin film formed in each coating process is more preferably in a range of 150 nm to 300 nm. In the invention, the thickness of a thin film formed in each coating process refers to the thickness obtained by dividing the total thickness of a PZT-based ferroelectric thin film formed after baking by the number of processes of coating a composition.

The PZT-based ferroelectric thin film 21 according to the embodiment contains the PZT-based particles 22 having an average particle size in the above-described range when measured on the surface of the thin film 21. As a result, an effect of increasing the service life is obtained. The PZT-based ferroelectric thin film 21 is configured by a Pb-containing composite metal oxide having a perovskite structure such as lead zirconate titanate (PZT), and the PZT-based particles 22 are crystal grains separated by grain boundaries. The reason why the average particle size of the PZT-based particles 22, which constitutes the thin film 21, when measured on the surface of the thin film is limited to be in the above-described range is as follows. When this average particle size is less than the lower limit, the effect of increasing the service life is not sufficiently obtained. When the average particle size is greater than the upper limit, the number of particles contained in one capacitor varies, and thus there is a problem in that properties of particles are greatly different from each other. The average particle is more preferably in a range of 1000 nm to 2000 nm. The particle size is controlled by adjusting the amount of a high-molecular compound added to a compound described below. In the invention, the average particle size of the PZT-based particles when measured on the surface of the thin film refers to the average particle size of 50 PZT-based particles when observed through an SEM image on the surface of the thin film. In the case of a spherical particle, the particle size of each particle refers to the diameter thereof. In the case of particles having the other shapes, the particle size of each particle refers to the average value of the size of a longest side of the particle and the size of a maximum side perpendicular to the longest side, or it refers to the average value of the maximum length of the particle and the maximum length of the particle in a direction perpendicular to the maximum length direction.

The PZT-based ferroelectric thin film 21 according to the embodiment may contain, instead of PZT, PLZT obtained by adding La to PZT, and contains metals such as Pb, Zr, or Ti at a desired metal atomic ratio. Specifically, the PZT-based ferroelectric thin film 21 contains 105 mol to 115 mol of Pb with respect to 100 mol of the total amount of Ti and Zr. That is, when PZT-based ferroelectric thin film 21 is represented by the formula "$(Pb_xLa_y)(Zr_zTi_{1-z})O_3$", the x value satisfies a range of $1.05 \leq x \leq 1.15$. In the PZT-based ferroelectric thin film 21 according to the embodiment, by limiting the ratio of Pb to in the above-described range, the heterogeneous fine particles 23 (pyrochlore phase) which are crystal grains are precipitated in grain boundaries between the grown PZT-based particles 22.

That is, as illustrated in FIG. 1, the PZT-based ferroelectric thin film 21 according to the embodiment has a structure in which the heterogeneous fine particles 23 having an average particle size of 20 nm or less, which are different from the PZT-based particles 22, are precipitated on a part or all of the grain boundaries on the surface of the thin film 21. These heterogeneous fine particles 23 are presumed to serve to increase the service life of the heterogeneous fine particles 23. As a result, the service life of the thin film 21 having superior electrical properties can be significantly increased. It is known that the pyrochlore phase decreases the electrical properties of a dielectric thin film when being formed in a thin film or the like. However, in this embodiment, the pyrochlore phase, that is, the heterogeneous fine particles 23 are precipitated on the above-described specific site of the thin film 21, and the particle size thereof is controlled. As a result, the service life of the thin film 21 is increased, it is preferable that the heterogeneous fine particles 23 be precipitated on the surface of the thin film at an average frequency of 30 or more particles per on each grain boundary surrounding each PZT-based particles 22.

The reason for limiting the ratio of Pb to be in the above-described range is as follows. When the ratio is higher than the upper limit, the heterogeneous fine particles 23 are not precipitated on the grain boundaries, and the effect of increasing the service life is not obtained. On the other hand, when the ratio is lower than the lower limit, the heterogeneous fine particles 23 are precipitated however, the relative dielectric constant is decreased, and a function and the like as a capacitor deteriorate. It is more preferable that the PZT-based ferroelectric thin film 21 contain 107 mol to 110 mol of Pb with respect to 100 mol of a total amount of Ti and Zr. The y value and the z value satisfy a range of $0 \leq y \leq 0.1$ and a range of $0.1 < z < 0.9$, respectively. In addition, the PZT-based ferroelectric thin film 21 according to the embodiment may contain, instead of PZT, PMnZT obtained by adding Mn to PZT or PNbZT obtained by adding Nb to PZT. The metal atomic ratio in the PZT-based ferroelectric thin film is adjusted by adjusting a mixing ratio of a PZT precursor in a composition described below which is used to thrill the thin film 21.

In addition, the reason for limiting the particle size of the heterogeneous fine particles 23 to be less than or equal to 20 nm is as follows. When the particle size is greater than 20 nm, there is a problem in that the leakage current density increases. The particle size of the heterogeneous fine particles 23 is more preferably in a range of 5 nm to 15 nm. The major component of the heterogeneous fine particles 23 is the pyrochlore phase represented by $Pb_2Ti_2O_7$, and the particle size thereof can be controlled by changing the x value in the above-described formula. In addition, the precipitation on the above-described specific site can be performed by adjusting the amount of an organic dopant in the film. In the invention, the particle size of the homogeneous fine particles refers to the average particle size of 50 homogeneous fine particles when observed through an SEM image on the surface of the thin film. At this time, the particle size of each particle refers to the average value of the size of a longest side of the particle and the size of a minimum side perpendicular to the longest side, or it refers to the average value of the maximum length of the particle and the minimum length of the particle in a direction perpendicular to the maximum length direction.

In addition, the total thickness of the thin film 21 is preferably in a range of 100 nm to 5000 nm. When the total thickness is less than 100 nm, the productivity of a film is poor, and there may be a problem of properties in that the leakage current density is increased. On the other hand, when the total thickness is greater than the upper limit, cracking is likely to occur. The total thickness of the thin film 21 is more preferably in a range of 300 nm to 3000 nm.

Next, a method of forming a PZT-based ferroelectric thin film according to an embodiment of the invention will be described. First, a PZT-based ferroelectric thin film-forming composition is coated on a lower electrode of a substrate one or two or more times to form a coating film (gel film) having a desired thickness thereon. At this time, as described above, it is preferable that a coating amount of the composition in each coating process be set such that the thickness of a thin film formed in each coating process in the thin film is in a range of 100 nm to 400 nm. The coating method is not particularly limited, and examples thereof include spin coating, dip coating, liquid source misted chemical deposition (LSMCD), and spin spray coating. As a substrate used to form a ferroelectric thin film, different substrates are used according to the uses thereof. For example, when a dielectric layer of a thin film capacitor or the like is formed, a heat-resistant substrate, such as a silicon substrate or a sapphire substrate, on which a lower electrode is formed is used. The lower substrate which is formed on the substrate is formed of a material, such as Pt, Ir, or Ru, which has conductivity and is not reactive with the ferroelectric thin film. In addition, for example, a substrate on which a lower electrode is formed with an adhesion layer, an insulating film and the like interposed therebetween can be used. Specific examples of the substrate include substrates having a laminate structure (lower electrode/adhesion layer/insulating film/substrate) of Pt/Ti/SiO$_2$/Si, Pt/TiO$_2$/SiO$_2$/Si, Pt/IrO$_2$/Ir/SiO$_2$/Si, Pt/TiN/SiO$_2$/Si, Pt/Ta/SiO$_2$/Si, or Pt/Ir/SiO$_2$/Si. On the other hand, in a piezoelectric element, a pyroelectric infrared detecting element, or the like, a heat-resistant substrate such as a silicon substrate, a SiO$_2$/Si substrate, or a sapphire substrate can be used.

The PZT-based ferroelectric thin film-forming composition is a raw material solution used to form a PZT-based ferroelectric thin film and is formed of an organic metal compound solution in which raw materials (PZT precursor) used to form the above-described complex metal oxide or the like in the formed ferroelectric thin film are dissolved in an appropriate solvent at a desired ratio, and concentrations thereof are adjusted to be suitable for coating.

As a material of the PZT precursor, a compound in which an organic group binds to a metal element such as Pb, La, Zr, and Ti through an oxygen or nitrogen atom of the organic group is preferable. Examples of such a compound include one or two or more elements selected from the group consisting of metal alkoxides, metal diol complexes, metal triol complexes, metal carboxylates, metal β-diketonate complexes, metal β-diketoester complexes, metal β-iminoketo complexes, and metal amino complexes. Particularly preferable compounds are metal alkoxides, and partial hydrolysates and organic acid salts thereof.

Specifically, examples of a Pb compound and a La compound include acetates such as lead acetate: Pb(OAc)$_2$ or lanthanum acetate: La(OAc)$_3$; and alkoxides such as lead diisopropoxide: Pb(OiPr)$_2$ or lanthanum triisopropoxide: La(OiPr)$_3$. Examples of a Ti compound include alkoxides such as titanium tetraethoxide: Ti(OEt)$_4$, titanium tetraisopropoxide: Ti(OiPr)$_4$, titanium tetra n-butoxide: Ti(OnBu)$_4$, titanium tetraisobutoxide: Ti(OiBu)$_4$, titanium tetra t-butoxide: Ti(OtBu)$_4$, or titanium dimethoxy diisopropoxide: Ti(OMe)$_2$(OiPr)$_2$. As a Zr compound, the same alkoxides as those of the Ti compound are preferable. Metal alkoxides may be used without any change, but partial hydrolysates thereof may be used in order to promote decomposition. In addition, examples of a Mn compound include manganese acetate, manganese 2-ethylhexanoate, and manganese naphthenate. In addition, examples of an Nb compound include niobium pentaethoxide and niobium 2-ethylhexanoate.

The PZT-based ferroelectric thin film forming composition contains Ti, Zr, and Pb such that the above-described desired metal atomic ratio is obtained by adjusting ratios thereof during the preparation of the composition. That is, the composition contains 105 mol to 115 mol, preferably 107 mol to 110 mol of Pb with respect to 100 mol of a total amount of Ti and Zr contained in the composition. When the ratio of Pb in the composition is out of the above-described range, the ratio of Pb in the formed thin film is also out of the above-described range, which causes the above-described problems.

The ratio of the UT precursor to 100 wt % of the composition is preferably 15 wt % to 35 wt % in terms of oxides. The reason to limit the ratio of the PZT precursor to be in the above-described range is as follows. When the ratio is lower than the lower limit, the thickness of a thin film formed in each coating process is not sufficient. On the other hand, when the ratio is higher than the upper limit, cracking is likely to occur. The ratio in terms of oxides refers to the ratio of metal oxides to 100 wt % of the composition which is calculated under the assumption that all the metal elements contained in the composition are converted into the metal oxides.

A solvent used to prepare the composition is appropriately determined according to the raw materials to be used. Typically, as the solvent, carboxylic acids, alcohols (for example, ethanol, 1-butanol, or polyols such as propylene glycol or ethylene glycol), esters, ketones (such as acetone or methyl ethyl ketone), ethers (such as dimethylether or diethylether), cycloalkanes (such as cyclohexane or cyclohexanol), aromatic compounds (such as benzene, toluene, or xylene) or tetrahydrofuran; or mixed solvents of two or more of the above-described solvents can be used.

Preferable examples of carboxylic acids include n-butyric acid, α-methylbutyric acid, i-valeric acid, 2-ethylbutyric acid, 2,2-dimethylbutyric acid, 3,3-dimethylbutyric acid, 2,3-dimethylbutyric acid, 3-methylpentanoic acid, 4-methylpentanoic acid, 2-ethylpentanoic acid, 3-ethylpentanoic acid, 2,2-dimethylpentanoic acid, 3,3-dimethylpentanoic acid, 2,3-dimethylpentanoic acid, 2-ethylhexanoic acid, and 3-ethylhexanoic acid.

In addition, preferable examples of esters include ethyl acetate, propyl acetate, n-butyl acetate, sec-butyl acetate, tert-butyl acetate, isobutyl acetate, n-amyl acetate, sec-amyl acetate, tert-amyl acetate and isoamyl acetate. Preferable examples of alcohols include 1-propanol, 2-propanol, 1-butanol, 2-butanol, isobutyl alcohol, 1-pentanol, 2-pentanol, 2-methyl-2-pentanol, and 2-methoxyethanol.

In addition, the composition contains, as a high-molecular compound, a polyvinyl pyrrolidone (PVP) and a polyethylene glycol. Polyvinyl pyrrolidone and polyethylene glycol are used to adjust, for example, the viscosity of the solution in the composition. Polyvinyl pyrrolidone can determine and adjust a relative viscosity based on a k value. "k value" described herein refers to a value representing a viscosity property, which correlates to a molecular weight, and is calculated according to the following Fikentscher's formula using a relative viscosity (25° C.) which is measured with a capillary viscometer.

$$k \text{ value} = (1.5 \log \eta\text{rel} - 1)/(0.15 + 0.003c) + (300c \log \eta\text{rel} + (c + 1.5c \log \eta\text{rel})^2)^{1/2}/(0.15c + 0.003c^2)$$

In the above formula, "ηrel" represents a relative viscosity of an aqueous polyvinyl pyrrolidone solution to water, and "c" represents a concentration (wt %) of polyvinyl pyrrolidone in an aqueous polyvinyl pyrrolidone solution.

The k value of polyvinyl pyrrolidone contained in the composition is preferably 15 to 90. In order to form a thick ferroelectric thin film, when the composition is coated on a substrate or the like, a sufficient viscosity is necessary to maintain the thickness of the coated coating film (gel film). However, when the k value is lower than the lower limit, it is difficult to obtain the sufficient viscosity. On the other hand, when the k value is higher than the upper limit, the viscosity is excessively high, and it is difficult to uniformly coat the composition. In addition, when polyethylene glycol is used, the polymerization degree is preferably 200 to 1000. When the polymerization degree is lower than the lower limit, it is difficult to obtain the sufficient viscosity. On the other hand, when the polymerization degree is higher than the upper limit, the viscosity is excessively high, and it is difficult to uniformly coat the composition. In addition, polyvinyl pyrrolidone is particularly preferable due to a large effect of suppressing cracking.

The ratio of the high molecular compound such as polyvinyl pyrrolidone or polyethylene glycol to 1 mol of the PZT precursor is set to be in a range of 0.15 mol to 0.50 mol in terms of monomers. When the ratio is lower than the lower limit, cracking is likely to occur. On the other hand, when the ratio is higher than the upper limit, pores are likely to be formed. In addition, when the ratio of the high-molecular compound is out of this range, the average particle size of the PZT-based particles is out of the desired range, which is likely to cause the above-described problems.

The molar value of the high-molecular compound in terms of monomers means a molar value based on the molecular weight of monomers consisting of the high-molecular compound, and the molar value of the high-molecular compound to 1 mol of the PZT precursor in terms of monomers is a molar value based on the molecular weight of monomers consisting of the high-molecular compound to 1 mol of the PZT precursor.

In addition to the above-described components, a stabilizer may be optionally added to the composition at a ratio (number of molecules of stabilizer)/(number of metal atoms) of about 0.2 to 3. Examples of the stabilizer include β-diketones (such as acetyl acetone, heptafluorobutanoyl pivaloyl methane, dipivaloyl methane, trifluoroacetyl acetone, or benzoyl acetone), β-ketonic acids (such as acetoacetic acid, propionyl acetic acid, or benzoyl acetic acid), β-keto esters (such as methyl, propyl, butyl, and other lower alkyl esters of the above-described ketonic acids), oxy acids (such as lactic acid, glycolic acid, α-hydroxybutyric acid, or salicylic acid), lower alkyl esters of the above-described oxy acids, oxyketones (such as diacetone alcohol or acetoin), diols, triols, higher carboxylic acids, alkanol amines (such as diethanolamine, triethanolamine, or monoethanolamine), and polyvalent amines.

It is preferable that the composition contain β-diketones or polyols. Among these, acetyl acetone is particularly preferable as β-diketones, and propylene glycol is particularly preferable as polyols.

In addition, the composition can contain a polar solvent such as a formamide-based solvent as an organic dopant. As the formamide-based solvent, any of formamide, N-triethyl formamide, or N—N-dimethyl formamide is preferably used. By using the formamide-based solvent or the like in combination with the polyvinyl pyrrolidone and the like, a film having a smaller amount of cracks and a dense structure can be formed. In addition, when the composition is coated, a more uniform coating film can be formed, and an effect of promoting the removal of a solvent during baking can be further improved. Examples of an organic dopant other than the formamide-based solvent include an ethanolamine such as monoethanolamine or diethanolamine, and this ethanolamine can be used in combination with the formamide-based solvent. This ethanolamine has an effect of increasing the storage stability of the solution by being coordinated to a metal alkoxide. The ratio of the organic dopant containing the formamide-based solvent to 100 wt % of the composition is preferably 3 wt % to 15 wt %.

In order to prepare the composition, first, the above-described Pb compound and the like of the PZT precursor are prepared and weighed at ratios for obtaining the desired metal atomic ratio, respectively. The weighed PZT precursor and a solvent such as propylene glycol are poured into a reaction vessel and mixed with each other, followed by reflux and reaction, preferably, in a nitrogen atmosphere at a temperature of 150° C. to 160° C. for 0.5 hours to 3 hours. As a result, a synthetic solution is prepared. After reflux it is preferable that a solvent be removed using a method such as atmospheric distillation or evaporation. In addition, when a stabilizer such as acetyl acetone is added, it is preferable that the stabilizer be added to the synthetic solution after the solvent removal, followed by reflux in a nitrogen atmosphere, at a temperature of 150° C. to 160° C. for 0.5 hours to 3 hours.

Next, a solvent is further added to the synthetic solution to adjust concentrations, an organic dopant containing a formamide-based solvent is added, and another solvent such as alcohol is added, followed by stirring to dilute the synthetic solution. As a result, the concentration of each component in the composition is adjusted to be the above-described desired concentration. A high-molecular compound such as polyvinyl pyrrolidone is added to the synthetic solution at a desired ratio, followed by stirring, preferably, at room temperature for 0.5 hours to 3 hours to be uniformly dispersed in the synthetic solution. As a result, a PZT-based ferroelectric thin film-forming composition according to the embodiment is obtained.

After the preparation of the composition, it is preferable that particles be removed from the composition by filtration or the like such that the number of particles having a particle, size of 0.5 μm or greater (preferably 0.3 μm or greater and more preferably 0.2 μm or greater) be less than or equal to 50 particles per 1 mL of the composition. When the number of particles having a particle size of 0.5 μm or greater in the composition is more than 50 particles per 1 mL of the composition, long-term storage stability deteriorates. The less number of particles having a particle size of 0.5 μm or greater in the composition, the better. In particular, the number of particles is preferably less than or equal to 30 particles per 1 mL of the composition.

A method of treating the prepared composition such that the number of particles is in the above-described range is not particularly limited. For example, the following method may be used. A first method is a filtration method of supplying pressure with a syringe using a commercially available membrane filter having a pore size of 0.2 μm. A second method is a pressure filtration method in which a commercially available membrane filter having a pore size of 0.05 μm is combined with a pressure tank. A third method is a circulation filtration method in which the filter used in the second method is combined with a solution circulating tank.

In all the methods, a particle capture rate by the filter varies depending on a supply pressure of the composition. It is generally known that, the lower the pressure, the higher the capture rate. Particularly in the first method or the second method, in order to realize the condition that the number of particles having a particle size of 0.5 μm or greater is less than or equal to 50 particles per 1 mL of the composition, it is preferable that the composition be made to pass extremely slowly through the filter at a low pressure.

The above-obtained composition is coated on a lower electrode to form a coating film. Next, this coating film is pre-baked and further baked to be crystallized. It is preferable that baking be performed using a hot plate or RTA in the air at 150° C. to 450° C. for 1 minute to 10 minutes. A temperature increase rate from room temperature to a pre-baking temperature is preferably 2.5° C./sec to 50° C./sec. It is preferable that pre-baking be performed in the air, in an oxygen atmosphere or in a water vapor-containing atmosphere in order to remove a solvent and to thermally decompose or hydrolyze a metal compound to be transformed into a complex oxide. Even during heating in the air, moisture required for hydrolysis is sufficiently secured with moisture in the air. This heating may be performed in two stages: low-temperature heating to remove a solvent and high-temperature heating used to decompose an organic metal compound.

The coating process of the composition to the pre-baking process may be performed once. However, it is preferable that these processes be repeated multiple times until a film having a predetermined thickness is obtained, and, finally; baking be performed in a batch process.

Baking is the process of baking the pre-baked coating film at a crystallization temperature or higher to be crystallized. As a result a ferroelectric thin film is obtained. As a baking atmosphere in this crystallization process, $O_2$, $N_2$, Ar, $N_2O$, $H_2$, or a mixed gas thereof is preferable. Baking is performed at 600° C. to 700° C. for 1 minute to 5 minutes. Baking may be performed by, rapid thermal annealing (RTA). When baking is performed by RTA, a temperature increase rate thereof is preferably 2.5° C./sec to 100° C./sec.

Through the above-described processes, the PZT-based ferroelectric thin film is obtained. In this ferroelectric thin film, the number of processes during film formation is small. Moreover, in spite that the thick film is relatively simply obtained, the generation of cracks is rare. In addition, since the thin film has a dense structure, electrical properties are extremely superior, and the service life thereof is significantly increased.

Accordingly, the PZT-based ferroelectric thin film obtained using the above-described method according to the embodiment can be desirably used as a constituent material of a composite electronic component such as a thin film capacitor, a capacitor, an IPD, a DRAM memory capacitor, a laminated capacitor, a gate insulator of a transistor, a non-volatile memory, a pyroelectric infrared detecting element, a piezoelectric element, an electro-optic element, an actuator, a resonator, an ultrasonic motor, an electric switch, an optical switch, or an LC noise filter element.

EXAMPLES

Next, Examples of the invention and Comparative Examples wall be described in detail.

Example 1-1

First, as the PZT precursor, lead acetate trihydrate (Pb source), titanium tetraisopropoxide (Ti source), and zirconium tetrabutoxide (Zr source) were weighed such that a metal atomic ratio (Pb/Zr/Ti) was 115/52/48. These materials were added to propylene glycol in a reaction vessel. As a result, a synthetic solution was prepared. After the synthetic solution was re-fluxed in a nitrogen atmosphere at a temperature of 150° C. for 60 minutes, the solvent was removed from the synthetic solution by distillation. Next, acetyl acetone as the stabilizer was added to the synthetic solution.

Next, propylene glycol was added to the synthetic solution to dilute the synthetic solution such that the concentration of the PZT precursor was 35 wt % ire terms of oxides. Further, ethanol and N-methyl formamide were added to the synthetic solution to dilute the synthetic solution such that the concentration of the PZT precursor was 25 wt % in terms of oxides. Next, 0.30 enol of polyvinyl pyrrolidone (k value=30) with respect to 1 mol of the PZT precursor was added to the synthetic solution, followed by stirring at a temperature of room temperature for 24 hours. N-methyl formaldehyde was added to the synthetic solution such that the concentration thereof in the synthetic solution was 7 wt %, followed by stirring for 2 hours and stabilization for 24 hours. As a result, a composition used to form a PZT ferroelectric thin film was obtained. This composition was filtered through a commercially available membrane filter having a pore size of 0.2 μm by supplying a pressure thereto with as syringe. The number of particles having a particle size of 0.5 μm or greater was 3 particles per 1 mL of the solution.

The obtained composition was dripped on a Pt film (lower electrode) of a Pt/$TiO_2$/$SiO_2$/Si substrate which was set on a spin coater, followed by spin-coating at a rotating speed of 2000 rpm for 60 seconds. As a result, a coating film (gel film) was formed on the lower electrode.

Figure 4:
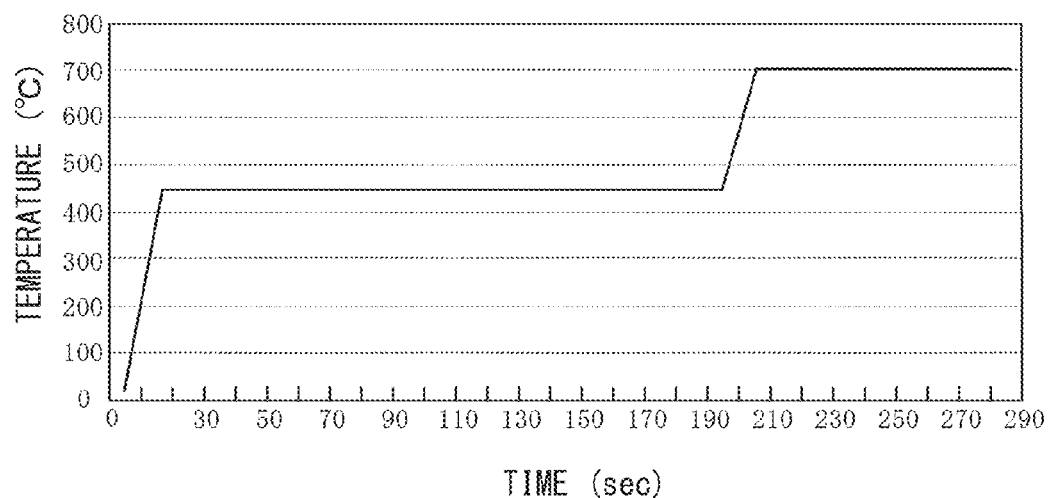
FIG. 4 is a graph illustrating an example of a temperature profile in a high-temperature process during the formation of a thin film according to an embodiment of the invention.

Next, the coating film which was formed on the substrate was pre-baked and baked according to a temperature profile illustrated in FIG. 4. As a result, a PZT ferroelectric thin film was formed. Specifically, first, before pre-baking and baking, the substrate on which the coating film was formed was held in the air at a temperature of 175° C. for 1 minute using a hot plate. As a result, a low-boiling-point solvent and adsorbed water molecules were removed.

Next, as illustrated in FIG. 4, using RTA, in an oxygen atmosphere, the coating film was pre-baked by being heated from room temperature to 450° C. at a temperature increase rate of 30° C./sec and being held at this temperature for 3 minutes and was baked by being heated to 700° C. at a temperature increase rate of 30° C./sec and being held at this temperature for 1 minute. As a result, a PZT ferroelectric thin film was formed on the lower electrode of the substrate.

Examples 1-2 to 1-4 and Comparative Examples 1-1 and 1-2

PZT ferroelectric thin films were formed with the same method as that of Example 1-1, except that the ratio of the PZT precursor to the composition, the coating amount of the composition, or the amount of polyvinyl pyrrolidone added were changed as shown in Table 1 below.

Examples 2-1 and 2-2

PZT ferroelectric thin films were formed with the same method as that of Example 1-1, except that the ratio of the PZT precursor to the composition, the coating amount of the composition or the number of coating processes thereof, and the amount of polyvinyl pyrrolidone added were changed as shown in Table 1 below. In Example 1-2, by repeating the processes from the formation of the coating film to pre-baking four times and performing baking once, a film having a desired total thickness was formed.

Examples 3-1 and 3-2 and Comparative Examples 2-1 and 2-2

PZT ferroelectric thin films were formed with the same method as that of Example 1-1, except that the ratio of the PZT precursor to the composition and the amount of polyvinyl pyrrolidine added were changed as shown in Table 1 below.

Comparative Test and Evaluation

Regarding each of the PZT ferroelectric thin films formed in Examples 1-1 to 3-2 and Comparative Examples 1-1 to 2-2, the film thickness, the film structure (the average particle size of the PZT-based particles, the average particle size of the heterogeneous fine particles, whether or not cracking occurred), the average fracture life, and the electrical properties (relative dielectric constant) were evaluated. The results were shown in Table 1 below.

(1) Film Thickness: The thickness (total thickness) of a cross-section of the formed ferroelectric thin film was measured using a spectroscopic ellipsometer (M-2000D1 manufactured by J. A. Woollam Co. Inc.). In Table 1, the thickness of a thin film formed in each coating process refers to a value obtained by dividing the total thickness of the ferroelectric thin film by the number of coating processes.

Figure 2:
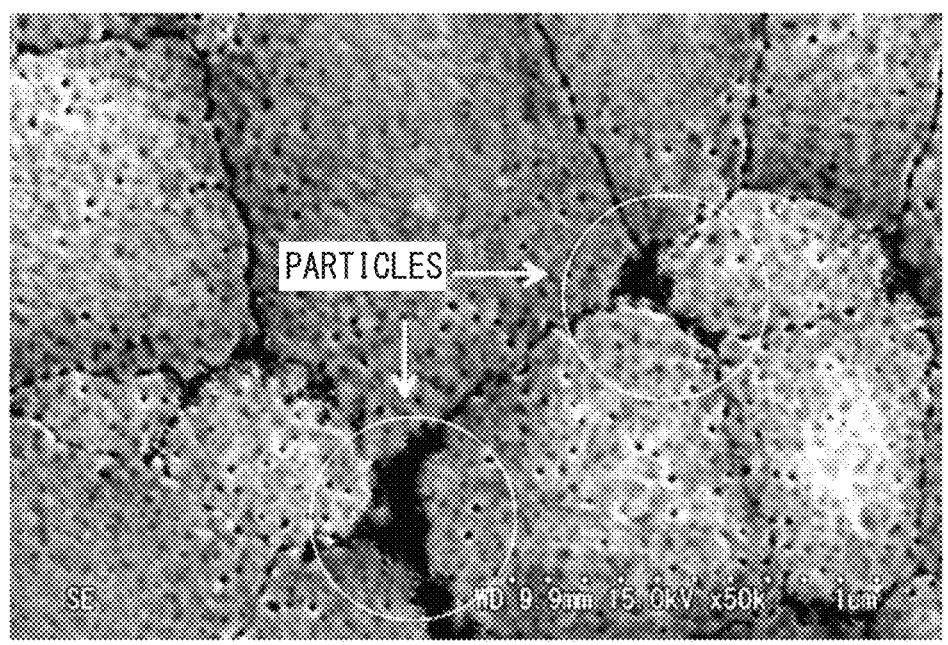
FIG. 2 is a photograph obtained by observing a surface of a PZT-based ferroelectric thin film obtained in Example 1-1 with a scanning electron microscope (SEM).
Figure 3:
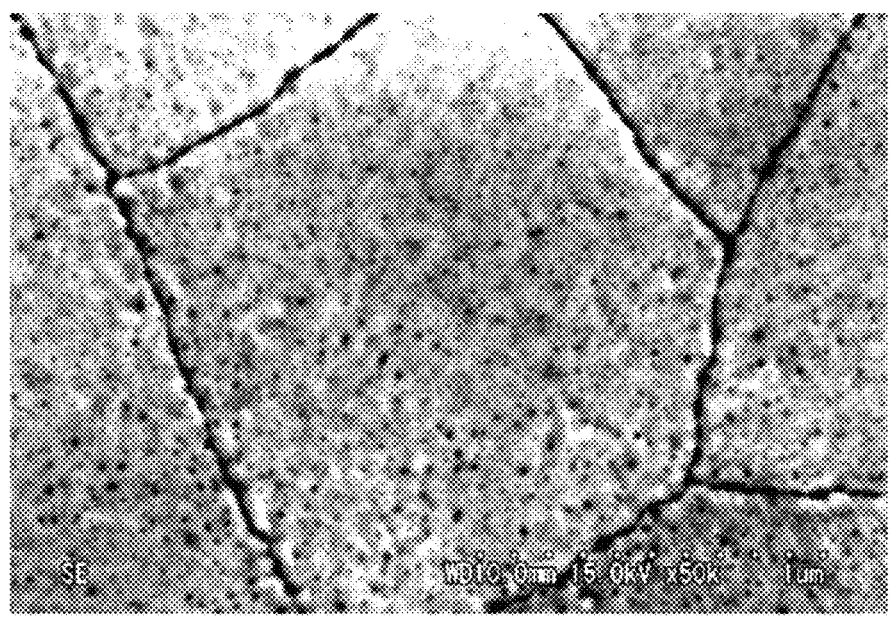
FIG. 3 is a photograph obtained by observing a surface of a PZT-based ferroelectric thin film obtained in Comparative Example 1-2 with an SEM.

(2) Film structure: SEM images of the structures of the surface and the cross-section of the film were observed using the scanning electron microscope used in the thickness measurement. FIGS. 2 and 3 are representative diagrams illustrating the photographs of the surfaces of the films of Example 1-1 and Comparative Example 1-2 observed at this time. In addition, particle sizes of 50 PZT-based articles were measured when observed through an SEM image, and the average value was set as the average particle size of the PZT-based particles. At this time, the particle size of each particle refers to, in the case of a spherical particle, the diameter thereof and, in the case of particles having the other shapes, to the average value of the size of a longest side of the particle and the size of a maximum side perpendicular to the longest side, or it refers to the average value of the maximum length of the particle and the maximum length of the particle in a direction perpendicular to the maximum length direction.

In addition, particle sizes of 50 heterogeneous fine particles were measured when observed through an SEM image, and the average value was set as the average particle size of the homogeneous fine particles. At this time, the particle size of each particle refers to the average value of the maximum length of the particle and the minimum length of the particle in a direction perpendicular to the maximum length direction. In addition, whether or not cracking occurred or not was observed through the SEM image.

(3) Highly accelerated life test: In order to investigate electrical properties of the obtained film, a constant voltage was applied to the film under conditions of a high temperature and a high voltage in a highly accelerated life test. An electrode having a size of 200 μmφ was formed on a surface of the formed PZT ferroelectric thin film using a sputtering method, and damage recovery annealing was performed by RTA in an oxygen atmosphere at a temperature of 700° C. for 1 minute. As a result, thin film capacitors were obtained as test samples. A field intensity of 0.52 MV/cm was applied to the test samples at a measurement temperature of 60° C., and a chronological change in leakage current was continued until all the samples were broken down. Regarding each of Examples and Comparative Examples, 22 test samples were prepared. According to Weibull Statistical Analysis, the time when 63.2% of the samples were broken down was set as an average breakdown time. The breakdown time was defined as the time when the leakage current reaches 100 μA.

(4) Relative dielectric constant: The measurement was performed using a ferroelectric tester (IF-Analyzer 2000, manufactured by aixACCT Systems GmbH). Specifically, similarly to the case of the highly accelerated life test, an electrode having a size of 200 μmφ as formed on a surface of the formed PZT ferroelectric thin film using a sputtering method, and damage recovery annealing was performed by RTA in an oxygen atmosphere at a temperature of 700° C. for 1 minute, thereby obtaining as thin film capacitor as a test sample. The relative dielectric constant of this thin film capacitor was measured.

TABLE 1

| | Metal Atomic Ratio (mol) | | | Ratio of High-Molecular Compound | Number of Coating Processes | Film Thickness (nm) | | Average Particle Size of PZT-Based Particles | Average Particle Size of Homogeneous Fine Partilces | Cracking | Average Breakdown Time | Relative Dielectric Constant |
|---|---|---|---|---|---|---|---|---|---|---|---|---|
| | Pb | Zr | Ti | (mol) | (Times) | In Each Coating Process | Total Thickness | (nm) | (nm) | | (sec) | |
| Ex. 1-1 | 115 | 52 | 48 | 0.30 | 1 | 300 | 300 | 1000 | 10 | None | $6.1 \times 10^3$ | 1520 |
| Ex. 1-2 | 107 | 52 | 48 | 0.32 | 1 | 300 | 300 | 1200 | 16 | None | $1.01 \times 10^4$ | 1550 |
| Ex. 1-3 | 105 | 52 | 48 | 0.15 | 1 | 300 | 300 | 500 | 20 | None | $1.32 \times 10^4$ | 1300 |
| Ex. 1-4 | 115 | 52 | 48 | 0.24 | 1 | 400 | 400 | 800 | 10 | None | $8.5 \times 10^3$ | 1370 |
| Comp. Ex. 1-1 | 103 | 52 | 48 | 0.28 | 1 | 300 | 300 | 1000 | 22 | None | $4.2 \times 10^3$ | 1230 |
| Comp. Ex. 1-2 | 117 | 52 | 48 | 0.36 | 1 | 300 | 300 | 1700 | — | None | $4.3 \times 10^3$ | 1650 |
| Ex. 2-1 | 110 | 52 | 48 | 0.50 | 4 | 100 | 400 | 3000 | 15 | None | $9.2 \times 10^3$ | 1750 |

TABLE 1-continued

| | Metal Atomic Ratio (mol) | | | Ratio of High-Molecular Compound | Number of Coating Processes | Film Thickness (nm) | | Average Particle Size of PZT-Based Particles | Average Particle Size of Homogeneous Fine Partilces | | Average | |
|---|---|---|---|---|---|---|---|---|---|---|---|---|
| | | | | | | In Each Coating Process | Total Thickness | | | | Breakdown Time | Relative Dielectric |
| | Pb | Zr | Ti | (mol) | (Times) | | | (nm) | (nm) | Cracking | (sec) | Constant |
| Ex. 2-2 | 110 | 52 | 48 | 0.24 | 1 | 400 | 400 | 800 | 15 | None | $7.4 \times 10^3$ | 1410 |
| Ex. 3-1 | 110 | 52 | 48 | 0.25 | 1 | 300 | 300 | 500 | 15 | None | $9.3 \times 10^3$ | 1320 |
| Ex. 3-2 | 110 | 52 | 48 | 0.50 | 1 | 300 | 300 | 3000 | 15 | None | $1.26 \times 10^3$ | 1690 |
| Comp. Ex. 2-1 | 110 | 52 | 48 | 0.13 | 1 | 300 | 300 | 480 | 15 | None | $2.8 \times 10^3$ | 1200 |
| Comp. Ex. 2-2 | 110 | 52 | 48 | 0.60 | 1 | 300 | 300 | 3200 | 15 | None | $5.9 \times 10^3$ | 1700 |

As clearly seen from Table 1, in Comparative Example 1-1 in which the average particle size of the homogeneous fine particles precipitated in the thin film was greater than 20 nm, the average breakdown time was shorter than those of Examples 1-1 to 1-4, and particularly the relative dielectric constant was significantly decreased. In addition, in Comparative Example 1-2 in which the homogeneous fine particles were not precipitated in the thin film, the average breakdown time was significantly shortened.

In addition, in Comparative Example 2-1 in which the average particle size of the PZT-based particles was less than 500 nm, the average breakdown time was significantly shorter than that of Example 3-1, and the relative dielectric constant was also significantly decreased. In addition, in Comparative Example 2-2 in which the average particle size of the PZT-based particles was greater than 3000 nm, the relative dielectric constant was high, but the average breakdown time was significantly shorter than that of Example 3-1.

On the other hand, in Examples 1-1 to 3-2, cracking did not occur, and the thin films having superior electrical properties and service life reliability were able to be obtained with high production efficiency.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

INDUSTRIAL APPLICABILITY

The present invention can be used to manufacture a composite electronic component such as a thin film capacitor, a capacitor, an IPD, a DRAM memory capacitor, a laminated capacitor, a gate insulator of a transistor, a non-volatile memory, a pyroelectric infrared detecting element, a piezoelectric element, an electro-optic element, an actuator, a resonator, an ultrasonic motor, an electric switch, an optical switch, or an LC noise filter element.

What is claimed is:
1. A PZT-based ferroelectric thin film which is formed by coating a PZT-based ferroelectric thin film-forming composition on a lower electrode of a substrate one or two or more times, pre-baking the composition, and baking the composition to be crystallized, the thin film comprising:
PZT-based particles having an average particle size in a range of 500 nm to 3000 nm when measured on a surface of the thin film,
wherein heterogeneous fine particles having an average particle size of 20 nm or less, which are different from the PZT-based particles, are precipitated on a part or all of the grain boundaries on the surface of the thin film.
2. The PZT-based ferroelectric thin film according to claim 1,
wherein the thickness of a thin film formed in each coating process is in a range of 100 nm to 400 nm.
3. The PZT-based ferroelectric thin film according to claim 2,
wherein the total thickness of the thin film is in a range of 100 nm to 5000 nm.
4. A complex electronic component comprising:
the PZT-based ferroelectric thin film according to claim 2 or a PZT-based ferroelectric thin film formed using the method comprising:
coating a PZT-based ferroelectric thin film-forming composition, which contains a PZT precursor, on a lower electrode of a substrate once or twice or more;
pre-baking the composition; and
baking the composition to be crystallized and to form a PZT-based ferroelectric thin film on the lower electrode,
wherein the composition contains 105 mol to 115 mol of Pb with respect to 100 mol of a total amount of Ti and Zr contained in the composition, and
the composition contains 0.15 mol to 0.50 mol of a high-molecular compound in terms of monomers with respect to 1 mol of the PZT precursor;
wherein the complex electronic component is a thin film capacitor, a capacitor, an IPD, a DRAM memory capacitor, a laminated capacitor, a gate insulator of a transistor, a non-volatile memory, a pyroelectric infrared detecting element, a piezoelectric element, an electro-optic element, an actuator, a resonator, an ultrasonic motor, an electric switch, an optical switch, or an LC noise filter element.
5. A complex electronic component comprising:
the PZT-based ferroelectric thin film according to claim 2 or a PZT-based ferroelectric thin film formed using the method comprising:
coating a PZT-based ferroelectric thin film-forming composition, which contains a PZT precursor, on a lower electrode of a substrate once or twice or more;
pre-baking the composition; and
baking the composition to be crystallized and to form a PZT-based ferroelectric thin film on the lower electrode, wherein the composition contains 105 mol to 115 mol of Pb with respect to 100 mol of a total amount of Ti and Zr contained in the composition, the composition contains 0.15 mol to 0.50 mol of a high-molecular compound in terms of monomers with respect to 1 mol of the PZT precursor, and wherein a coating amount of the composition in each coating process is set such that the thickness of a thin film formed in each coating process is in a range of 100 nm to 400 nm;

wherein the complex electronic component is a thin film capacitor, a capacitor, an IPD, a DRAM memory capacitor, a laminated capacitor, a gate insulator of a transistor, a non-volatile memory, a pyroelectric infrared detecting element, a piezoelectric element, an electro-optic element, an actuator, a resonator, an ultrasonic motor, an electric switch, an optical switch, or an LC noise filter element.

6. A complex electronic component comprising:
the PZT-based ferroelectric thin film according to claim 2 or a PZT-based ferroelectric thin film formed using the method comprising:
coating a PZT-based ferroelectric thin film-forming composition, which contains a PZT precursor, on a lower electrode of a substrate once or twice or more; pre-baking the composition; and
baking the composition to be crystallized and to form a PZT-based ferroelectric thin film on the lower electrode,
wherein the composition contains 105 mol to 115 mol of Pb with respect to 100 mol of a total amount of Ti and Zr contained in the composition,
the composition contains 0.15 mol to 0.50 mol of a high-molecular compound in terms of monomers with respect to 1 mol of the PZT precursor, and
wherein a PZT-based ferroelectric thin film having a total thickness in a range of 100 nm to 5000 nm is obtained by coating the composition one or two or more times;
wherein the complex electronic component is a thin film capacitor, a capacitor, an IPD, a DRAM memory capacitor, a laminated capacitor, a gate insulator of a transistor, a non-volatile memory, a pyroelectric infrared detecting element, a piezoelectric element, an electro-optic element, an actuator, a resonator, an ultrasonic motor, an electric switch, an optical switch, or an LC noise filter element.

7. A complex electronic component comprising:
the PZT-based ferroelectric thin film according to claim 2 or a PZT-based ferroelectric thin film formed using the method comprising:
coating a PZT-based ferroelectric thin film-forming composition, which contains a PZT precursor, on a lower electrode of a substrate once or twice or more; pre-baking the composition; and
baking the composition to be crystallized and to form a PZT-based ferroelectric thin film on the lower electrode,
wherein the composition contains 105 mol to 115 mol of Pb with respect to 100 mol of a total amount of Ti and Zr contained in the composition,
the composition contains 0.15 mol to 0.50 mol of a high-molecular compound in terms of monomers with respect to 1 mol of the PZT precursor, wherein a coating amount of the composition in each coating process is set such that the thickness of a thin film formed in each coating process is in a range of 100 nm to 400 nm, and wherein a PZT-based ferroelectric thin film having a total thickness in a range of 100 nm to 5000 nm is obtained by coating the composition one or two or more times;

wherein the complex electronic component is a thin film capacitor, a capacitor, an IPD, a DRAM memory capacitor, a laminated capacitor, a gate insulator of a transistor, a non-volatile memory, a pyroelectric infrared detecting element, a piezoelectric element, an electro-optic element, an actuator, a resonator, an ultrasonic motor, an electric switch, an optical switch, or an LC noise filter element.

8. The PZT-based ferroelectric thin film according to claim 1,
wherein the total thickness of the thin film is in a range of 100 nm to 5000 nm.

9. A complex electronic component comprising:
the PZT-based ferroelectric thin film according to claim 8 or a PZT-based ferroelectric thin film formed using the method comprising:
coating a PZT-based ferroelectric thin film-forming composition, which contains a PZT precursor, on a lower electrode of a substrate once or twice or more; pre-baking the composition; and
baking the composition to be crystallized and to form a PZT-based ferroelectric thin film on the lower electrode,
wherein the composition contains 105 mol to 115 mol of Pb with respect to 100 mol of a total amount of Ti and Zr contained in the composition, and
the composition contains 0.15 mol to 0.50 mol of a high-molecular compound in terms of monomers with respect to 1 mol of the PZT precursor;
wherein the complex electronic component is a thin film capacitor, a capacitor, an IPD, a DRAM memory capacitor, a laminated capacitor, a gate insulator of a transistor, a non-volatile memory, a pyroelectric infrared detecting element, a piezoelectric element, an electro-optic element, an actuator, a resonator, an ultrasonic motor, an electric switch, an optical switch, or an LC noise filter element.

10. A complex electronic component comprising:
the PZT-based ferroelectric thin film according to claim 8 or a PZT-based ferroelectric thin film formed using the method comprising:
coating a PZT-based ferroelectric thin film-forming composition, which contains a PZT precursor, on a lower electrode of a substrate once or twice or more; pre-baking the composition; and
baking the composition to be crystallized and to form a PZT-based ferroelectric thin film on the lower electrode,
wherein the composition contains 105 mol to 115 mol of Pb with respect to 100 mol of a total amount of Ti and Zr contained in the composition,
the composition contains 0.15 mol to 0.50 mol of a high-molecular compound in terms of monomers with respect to 1 mol of the PZT precursor, and
wherein a coating amount of the composition in each coating process is set such that the thickness of a thin film formed in each coating process is in a range of 100 nm to 400 nm;

wherein the complex electronic component is a thin film capacitor, a capacitor, an IPD, a DRAM memory capacitor, a laminated capacitor, a gate insulator of a transistor, a non-volatile memory, a pyroelectric infrared detecting element, a piezoelectric element, an electro-optic element, an actuator, a resonator, an ultrasonic motor, an electric switch, an optical switch, or an LC noise filter element.

11. A complex electronic component comprising:
the PZT-based ferroelectric thin film according to claim 8 or a PZT-based ferroelectric thin film formed using the method comprising:
coating a PZT-based ferroelectric thin film-forming composition, which contains a PZT precursor, on a lower electrode of a substrate once or twice or more;
pre-baking the composition; and
baking the composition to be crystallized and to form a PZT-based ferroelectric thin film on the lower electrode,
wherein the composition contains 105 mol to 115 mol of Pb with respect to 100 mol of a total amount of Ti and Zr contained in the composition,
the composition contains 0.15 mol to 0.50 mol of a high-molecular compound in terms of monomers with respect to 1 mol of the PZT precursor, and
wherein a PZT-based ferroelectric thin film having a total thickness in a range of 100 nm to 5000 nm is obtained by coating the composition one or two or more times;
wherein the complex electronic component is a thin film capacitor, a capacitor, an IPD, a DRAM memory capacitor, a laminated capacitor, a gate insulator of a transistor, a non-volatile memory, a pyroelectric infrared detecting element, a piezoelectric element, an electro-optic element, an actuator, a resonator, an ultrasonic motor, an electric switch, an optical switch, or an LC noise filter element.

12. A complex electronic component comprising:
the PZT-based ferroelectric thin film according to claim 8 or a PZT-based ferroelectric thin film formed using the method comprising:
coating a PZT-based ferroelectric thin film-forming composition, which contains a PZT precursor, on a lower electrode of a substrate once or twice or more;
pre-baking the composition; and
baking the composition to be crystallized and to form a PZT-based ferroelectric thin film on the lower electrode,
wherein the composition contains 105 mol to 115 mol of Pb with respect to 100 mol of a total amount of Ti and Zr contained in the composition,
the composition contains 0.15 mol to 0.50 mol of a high-molecular compound in terms of monomers with respect to 1 mol of the PZT precursor,
wherein a coating amount of the composition in each coating process is set such that the thickness of a thin film formed in each coating process is in a range of 100 nm to 400 nm, and
wherein a PZT-based ferroelectric thin film having a total thickness in a range of 100 nm to 5000 nm is obtained by coating the composition one or two or more times;
wherein the complex electronic component is a thin film capacitor, a capacitor, an IPD, a DRAM memory capacitor, a laminated capacitor, a gate insulator of a transistor, a non-volatile memory, a pyroelectric infrared detecting element, a piezoelectric element, an electro-optic element, an actuator, a resonator, an ultrasonic motor, an electric switch, an optical switch, or an LC noise filter element.

13. A complex electronic component comprising:
the PZT-based ferroelectric thin film according to claim 1 or a PZT-based ferroelectric thin film formed using the method comprising:
coating a PZT-based ferroelectric thin film-forming composition, which contains a PZT precursor, on a lower electrode of a substrate once or twice or more;
pre-baking the composition; and
baking the composition to be crystallized and to form a PZT-based ferroelectric thin film on the lower electrode,
wherein the composition contains 105 mol to 115 mol of Pb with respect to 100 mol of a total amount of Ti and Zr contained in the composition, and
the composition contains 0.15 mol to 0.50 mol of a high-molecular compound in terms of monomers with respect to 1 mol of the PZT precursor,
wherein the complex electronic component is a thin film capacitor, a capacitor, an IPD, a DRAM memory capacitor, a laminated capacitor, a gate insulator of a transistor, a non-volatile memory, a pyroelectric infrared detecting element, a piezoelectric element, an electro-optic element, an actuator, a resonator, an ultrasonic motor, an electric switch, an optical switch, or an LC noise filter element.

14. A complex electronic component comprising:
the PZT-based ferroelectric thin film according to claim 1 or a PZT-based ferroelectric thin film formed using the method comprising:
coating a PZT-based ferroelectric thin film-forming composition, which contains a PZT precursor, on a lower electrode of a substrate once or twice or more;
pre-baking the composition; and
baking the composition to be crystallized and to form a PZT-based ferroelectric thin film on the lower electrode,
wherein the composition contains 105 mol to 115 mol of Pb with respect to 100 mol of a total amount of Ti and Zr contained in the composition,
the composition contains 0.15 mol to 0.50 mol of a high-molecular compound in terms of monomers with respect to 1 mol of the PZT precursor, and
wherein a coating amount of the composition in each coating process is set such that the thickness of a thin film formed in each coating process is in a range of 100 nm to 400 nm;
wherein the complex electronic component is a thin film capacitor, a capacitor, an IPD, a DRAM memory capacitor, a laminated capacitor, a gate insulator of a transistor, a non-volatile memory, a pyroelectric infrared detecting element, a piezoelectric element, an electro-optic element, an actuator, a resonator, an ultrasonic motor, an electric switch, an optical switch, or an LC noise filter element.

15. A complex electronic component comprising:
the PZT-based ferroelectric thin film according to claim 1 or a PZT-based ferroelectric thin film formed using the method comprising:
coating a PZT-based ferroelectric thin film-forming composition, which contains a PZT precursor, on a lower electrode of a substrate once or twice or more;
pre-baking the composition; and baking the composition to be crystallized and to form a PZT-based ferroelectric thin film on the lower electrode, wherein the composition contains 105 mol to 115 mol of Pb with respect to 100 mol of a total amount of Ti and Zr contained in the composition, the composition contains 0.15 mol to 0.50 mol of a high-molecular compound in terms of monomers with respect to 1 mol of the PZT precursor, and wherein a PZT-based ferroelectric thin film having a total thickness in a range of 100 nm to 5000 nm is obtained by coating the composition one or two or more times;

wherein the complex electronic component is a thin film capacitor, a capacitor, an IPD, a DRAM memory capacitor, a laminated capacitor, a gate insulator of a transistor, a non-volatile memory, a pyroelectric infrared detecting element, a piezoelectric element, an electro-optic element, an actuator, a resonator, an ultrasonic motor, an electric switch, an optical switch, or an LC noise filter element.

16. A complex electronic component comprising:
the PZT-based ferroelectric thin film according to claim 1 or a PZT-based ferroelectric thin film formed using the method comprising:

coating a PZT-based ferroelectric thin film-forming composition, which contains a PZT precursor, on a lower electrode of a substrate once or twice or more;

pre-baking the composition; and baking the composition to be crystallized and to form a PZT-based ferroelectric thin film on the lower electrode, wherein the composition contains 105 mol to 115 mol of Pb with respect to 100 mol of a total amount of Ti and Zr contained in the composition, the composition contains 0.15 mol to 0.50 mol of a high-molecular compound in terms of monomers with respect to 1 mol of the PZT precursor, wherein a coating amount of the composition in each coating process is set such that the thickness of a thin film formed in each coating process is in a range of 100 nm to 400 nm, and wherein a PZT-based ferroelectric thin film having a total thickness in a range of 100 nm to 5000 nm is obtained by coating the composition one or two or more times;

wherein the complex electronic component is a thin film capacitor, a capacitor, an IPD, a DRAM memory capacitor, a laminated capacitor, a gate insulator of a transistor, a non-volatile memory, a pyroelectric infrared detecting element, a piezoelectric element, an electro-optic element, an actuator, a resonator, an ultrasonic motor, an electric switch, an optical switch, or an LC noise filter element.

17. A method of forming a PZT-based ferroelectric thin film, the method comprising:

coating a PZT-based ferroelectric thin film-forming composition, which contains a PZT precursor, on a lower electrode of a substrate once or twice or more;

pre-baking the composition; and baking the composition to be crystallized and to form a PZT-based ferroelectric thin film on the lower electrode, wherein the composition contains 105 mol to 115 mol of Pb with respect to 100 mol of a total amount of Ti and Zr contained in the composition, and the composition contains 0.15 mol to 0.50 mol of a high-molecular compound in terms of monomers with respect to 1 mol of the PZT precursor.

18. The method of forming a PZT-based ferroelectric thin film according to claim 17, wherein a coating amount of the composition in each coating process is set such that the thickness of a thin film formed in each coating process is in a range of 100 nm to 400 nm.

19. The method of forming a PZT-based ferroelectric thin film according to claim 18, wherein a PZT-based ferroelectric thin film having a total thickness in a range of 100 nm to 5000 nm is obtained by coating the composition one or two or more times.

20. The method of forming a PZT-based ferroelectric thin film according to claim 17, wherein a PZT-based ferroelectric thin film having a total thickness in a range of 100 nm to 5000 nm is obtained by coating the composition one or two or more times.

* * * * *